(12) United States Patent
Junes et al.

(10) Patent No.: US 11,226,364 B2
(45) Date of Patent: Jan. 18, 2022

(54) TESTING DEVICE

(71) Applicants: Afore Oy, Lieto (FI); BlueFors Cryogenics Oy, Helsinki (FI)

(72) Inventors: Aki Junes, Turku (FI); Ari Kuukkala, Turku (FI); Timo Salminen, Turku (FI); Vesa Henttonen, Turku (FI); Matti Manninen, Espoo (FI); David Gunnarsson, Helsinki (FI); Leif Roschier, Vantaa (FI)

(73) Assignees: Afore Oy, Lieto (FI); Bluefors Cryogenics Oy, Helsinki (FI)

( * ) Notice: Subject to any disclaimer, the term of this patent is extended or adjusted under 35 U.S.C. 154(b) by 29 days.

(21) Appl. No.: 16/861,264

(22) Filed: Apr. 29, 2020

(65) Prior Publication Data

US 2020/0348356 A1 Nov. 5, 2020

(30) Foreign Application Priority Data

May 3, 2019 (EP) .................................... 19172492

(51) Int. Cl.
*G01R 31/28* (2006.01)

(52) U.S. Cl.
CPC ..... *G01R 31/2877* (2013.01); *G01R 31/2865* (2013.01); *G01R 31/2887* (2013.01)

(58) Field of Classification Search
CPC . H01L 21/68785; H01L 22/00; H01L 21/682; H01L 21/6838; H01L 21/68714;
(Continued)

(56) References Cited

U.S. PATENT DOCUMENTS

| 4,757,255 A * | 7/1988 | Margozzi ............... G01R 1/073 324/750.03 |
| 5,093,550 A | 3/1992 | Gerber et al. |

(Continued)

FOREIGN PATENT DOCUMENTS

| CN | 106024692 A | 10/2016 |
| JP | H04137547 A | 5/1992 |
| WO | 0188965 A1 | 11/2001 |

OTHER PUBLICATIONS

SUSS Microtech: "Probe Systems PMC150", User Manual, Oct. 1, 2008, pp. 1-53, XP055636502, Retrieved from the Internet: URL:https://wiki.epfl.ch/carplat/documents/PMC150_Rel_02.pdf [retrieved on Oct. 28, 2019].

(Continued)

*Primary Examiner* — Vinh P Nguyen
(74) *Attorney, Agent, or Firm* — Merchant & Gould P.C.

(57) ABSTRACT

A testing device (100) is for electrically testing integrated circuits on a wafer (102). The testing device (100) includes a vacuum chamber (109), a chuck (101) for holding the wafer (102), a probe card (103) for electrically contacting the integrated circuits, and a radiation shield (107) arranged (Continued)

inside the vacuum chamber (109) and enclosing the chuck (101) and the probe card (103). In the testing device (100), the vacuum chamber (109) is provided with a gate valve (123), the radiation shield (107) is provided with a hatch (122), and the testing device (100) includes a wafer loading assembly (125) for loading the wafer (102) onto the chuck (101) through the gate valve (123) and the hatch (122).

13 Claims, 2 Drawing Sheets

(58) Field of Classification Search
CPC ......... H01L 21/67098; H01L 21/67242; H01L 21/671; H01L 21/66; H01L 21/68742; G01R 31/2887; G01R 1/07392; G01R 1/06705; G01R 1/18; G01R 31/2886; G01R 1/0416; G01R 1/06794; G01R 31/2851; G01R 31/307; G01R 31/2862; G01R 31/2891; G01R 1/025; G01R 31/2877; G01R 31/2865; G01R 31/2881; G01R 31/2831; G01R 31/2868; G01R 1/0408; G01R 1/0491; G01R 1/073; G01R 31/2893; G01R 31/311; G01R 31/2601; G01R 31/2637; G01R 31/2863; Y10T 279/11; Y10T 279/35
See application file for complete search history.

(56) References Cited

U.S. PATENT DOCUMENTS

| | | | | |
|---|---|---|---|---|
| 5,457,398 | A * | 10/1995 | Schwindt | A46D 1/00 |
| | | | | 324/750.27 |
| 5,835,997 | A * | 11/1998 | Yassine | G01R 1/18 |
| | | | | 324/750.14 |
| 10,522,499 | B2 * | 12/2019 | Enquist | H01L 25/065 |
| 11,099,211 | B1 * | 8/2021 | Najafi | G01R 31/2889 |
| 2002/0008534 | A1 | 1/2002 | Yamazaki | |
| 2005/0206396 | A1 * | 9/2005 | Yoshioka | G01R 31/2862 |
| | | | | 324/750.14 |
| 2008/0052948 | A1 | 3/2008 | Kim et al. | |
| 2010/0127714 | A1 * | 5/2010 | Negishi | G01R 29/26 |
| | | | | 324/613 |
| 2012/0102975 | A1 | 5/2012 | Garside et al. | |

OTHER PUBLICATIONS

Cyberey, M. et al.: "Closeout report for "Advanced Materials and on-wafer Chip Evaluation: 2nd Generation ALMA Superconducting Mixers"", ALMA Development Studies (Cycle 3), Mar. 1, 2017, pp. 1-44, XP055635734, Retrieved from the Internet: URL:https://science.nrao.edu/facilities/alma/alma-develop-old-022217/licht.pdf [retrieved on Oct. 24, 2019].

* cited by examiner

TESTING DEVICE

PRIORITY

This application claims the priority of European patent application number 19172492.1 filed on May 3, 2019, the contents of which are fully incorporated herein by reference.

TECHNICAL FIELD OF THE INVENTION

The present invention relates to a testing device according to the preamble of the appended independent claim.

BACKGROUND OF THE INVENTION

Semiconductor device fabrication is a commonly used process for creating integrated circuits on a wafer made of a semiconductor material using multiple-step sequence of photolithographic and chemical processing steps. As a part of the process, the integrated circuits created on the wafer are typically tested for functional defects by applying special test patterns to them. This testing is performed by using a testing device called a wafer prober.

An example of a known wafer prober comprises a chuck for holding a wafer to be tested and a probe card for electrically contacting integrated circuits on the wafer. The probe card is electrically connected to an electronic testing unit that electrically tests the integrated circuits according to a test program. The test program defines the contents of test patterns and the sequence by which they are applied to the integrated circuits. The chuck and the probe card are arranged inside a chamber, which allows the integrated circuits to be tested in a controlled environment. For electrical testing, the probe card is held in place while the wafer mounted on the chuck is moved between testing positions. In each testing position, contact elements of the probe card are arranged in electrical contact with contact pads of a set of integrated circuits, which are then electrically tested with the electronic testing unit.

A problem associated with known wafer probers is that loading of a wafer onto the chuck is difficult and time-consuming because the conditions, such as the temperature, pressure and humidity, in the chamber change significantly during the wafer loading. Restoring the conditions in the chamber after the wafer has been loaded takes time and consumes energy, especially if integrated circuits on the wafer need to be tested at very low temperatures, such as below 4 K.

OBJECTIVES OF THE INVENTION

It is the main objective of the present invention to reduce or even eliminate the prior art problems presented above.

It is an objective of the present invention to provide a testing device for electrically testing integrated circuits on a wafer. In more detail, it is an objective of the invention to provide a testing device enabling a wafer to be loaded onto and unloaded from a chuck of the testing device with minimal changes to the conditions inside the testing device. It is a further objective of the invention to provide a testing device enabling a wafer to be loaded onto and unloaded from a chuck of the testing device quickly and easily.

In order to realise the above-mentioned objectives, the testing device according to the invention is characterised by what is presented in the characterising portion of the appended independent claim. Advantageous embodiments of the invention are described in the dependent claims.

DESCRIPTION OF THE INVENTION

A testing device according to the invention comprises a vacuum chamber, a chuck for holding a wafer that comprises integrated circuits, a probe card for electrically contacting the integrated circuits on the wafer, and a radiation shield arranged inside the vacuum chamber and enclosing the chuck and the probe card. In the testing device according to the invention, the vacuum chamber is provided with a gate valve, the radiation shield is provided with a hatch, and the testing device comprises a wafer loading assembly for loading the wafer onto the chuck through the gate valve and the hatch.

The testing device according to the invention can be used for electrically testing integrated circuits on a wafer. This testing device can be called as a wafer prober. In the testing device according to the invention, the wafer to be tested is loaded with the wafer loading assembly onto the chuck, which is moved between testing positions. In each testing position, the probe card is in electrical contact with one or more integrated circuits, which can then be electrically tested.

The chuck is used to hold the wafer during testing of the integrated circuits. The chuck can be, for example, a mechanical chuck that comprises a plurality of heat conducting pins for holding the wafer on a base plate of the chuck. Alternatively, the chuck can be, for example, an electrostatic chuck that comprises a metal base plate coated with a layer of dielectric material. By providing a voltage difference between the metal base plate and the wafer, an electrostatic force holds the wafer on the chuck. To maintain the flatness of the wafer and facilitate the rapid transfer of heat from the wafer, the chuck is preferably made of a heat conducting material, such as copper or gold. The chuck can be made of gold-plated copper. These materials provide good thermal properties and performance.

The probe card is used to electrically contact the integrated circuits on the wafer. The probe card may comprise a printed circuit board (PCB) and one or more contact elements, which can be arranged in electrical contact with contact pads of the integrated circuits. The testing device may comprise a camera for optically locating the contact elements on the probe card and the contact pads on the wafer. By using this information, the contact pads of the integrated circuits to be tested can be aligned to the contact elements of the probe card.

The probe card can be attached to a probe card holder that is attached to the radiation shield. The probe card can be, for example, a needle, vertical pin, or MEMS (Micro Electro-Mechanical System) type probe card depending on the shape and form of the contact elements. The contact elements of the probe card can, for example, be made of tungsten or a tungsten/rhenium alloy. The contact pads of the integrated circuits can, for example, be made of aluminium, copper, copper alloys or many types of solders such as lead-tin and tin-silver. Typically, the probe card is custom-built for each type of wafer so that every integrated circuit on the wafer can be electrically tested.

The chuck and the probe card are arranged inside the radiation shield. The radiation shield acts as a thermal shield, reducing the heat transfer. In other words, the radiation shield is a thermal radiation shield. The radiation shield defines an essentially enclosed space into which the chuck and the probe card are placed. The radiation shield may consist of one or more shield parts. The radiation shield can be mechanically attached to but thermally isolated from the vacuum chamber or another radiation shield that encloses it. The radiation shield can comprise a cylindrical side wall, an upper end wall attached about its perimeter to the upper edge of the side wall, and a lower end wall attached about its perimeter to the lower edge of the side wall. The radiation shield can, for example, be made of aluminium.

Radiative heat transfer (emission/absorption) can be reduced by making surfaces of the radiation shield and the inner surface of the vacuum chamber reflecting. The heat reflecting surface can be, for example, polished metal. The fraction of the heat reflecting surfaces can be maximized and only the non-idealities, such as gaps in the geometry are compensated by making the surfaces locally heat absorbing. The heat absorbing surface can be, for example, black anodized or painted in black.

The hatch is attached to the wall, preferably a side wall, of the radiation shield. The hatch is preferably thermally anchored to the radiation shield with an aluminium or copper cable. The hatch is arranged in connection with an opening in the wall of the radiation shield. The hatch is movable between a closed position and an open position. In the closed position, the hatch closes the opening in the wall of the radiation shield so that the radiation is blocked. In the open position, a wafer can be loaded onto or unloaded from the chuck. Preferably, the hatch is arranged to only open inwards. The hatch is preferably rectangular. The hatch is preferably made of the same material than the radiation shield.

The vacuum chamber allows the integrated circuits to be tested in a controlled environment. The conditions such as the pressure and temperature inside the vacuum chamber can be controlled using various devices. The testing device may comprise, for example, a vacuum pump connected to the vacuum chamber for controlling the pressure and a cooling unit connected to the vacuum chamber for controlling the temperature inside the vacuum chamber. The vacuum chamber can, for example, be made of stainless steel or aluminium. When testing the integrated circuits, the pressure inside the vacuum chamber is typically less than 10 E-4 mbar.

The gate valve is attached to the wall, preferably a side wall, of the vacuum chamber. The gate valve is arranged in connection with an opening in the wall of the vacuum chamber. The gate valve can be closed or open. When the gate valve is closed, the interior of the vacuum chamber is isolated from the surroundings. When the gate valve is open, a wafer can be loaded onto or unloaded from the chuck.

The gate valve may comprise a round or rectangular gate, which can be moved with an actuator that is attached with a threaded stem to the gate. The gate valve is opened by lifting the gate. The sealing surfaces between the gate and seats are typically planar. The gate valve can be all-metal and made, for example, of stainless steel.

The wafer is loaded onto the chuck with the wafer loading assembly. The wafer loading assembly moves the wafer through the gate valve and the hatch onto the chuck as follows. First, the gate valve is opened, and the wafer is moved inside the vacuum chamber, and then the hatch is opened, and the wafer is moved inside the radiation shield and placed onto the chuck. The wafer loading assembly can also be used to unload the wafer from the chuck.

The testing device may comprise means for moving the chuck relative to the probe card. The moving means may comprise an actuator for moving the chuck in three perpendicular directions and another actuator for rotating the chuck around an axis. The actuators are preferably arranged outside the radiation shield or even outside the vacuum chamber so that the heat generated by the actuators does not heat the space in which integrated circuits are tested, i.e. the interior of the radiation shield. The moving means may comprise a supporting column having a first end and a second end. The first end of the supporting column can be attached to the chuck and the second end of the supporting column to the actuators. The movement produced by the actuators is thus transferred through the supporting column to the chuck. The supporting column can be made of a metal, such as stainless steel, or other material having good mechanical properties and a low thermal conductivity. The supporting column can be a one-piece or multi-piece tube that can be made of a sheet metal. The wall thickness of the tube can be in the range of 0.05 mm to 0.3 mm, which ensures that the heat transfer through the supporting column is minimal, while at the same time the supporting column is rigid enough to retain its shape.

The testing device may comprise an electronic testing unit for electrically testing the integrated circuits on the wafer. The electronic testing unit is electrically connected to the probe card. Preferably, the electronic testing unit is arranged outside the vacuum chamber. The probe card provides an electrical path between the electronic testing unit and the integrated circuits on the wafer, thereby permitting the testing and validation of the integrated circuits. The electronic testing unit tests the integrated circuits according to a test program, which defines the contents of test patterns and the sequence by which they are applied to the integrated circuits. The electronic testing unit may comprise a processor and a memory including computer program code, the memory and the computer program code being configured to, with the processor, cause the electronic testing unit to electrically test the integrated circuits.

An advantage of the testing device according to the invention is that a wafer can be loaded onto and unloaded from the chuck with minimal changes to the conditions in the space in which integrated circuits are tested, i.e. inside the radiation shield. Another advantage of the testing device according to the invention is that a wafer can be loaded onto and unloaded from the chuck quickly and easily.

According to an embodiment of the invention the wafer loading assembly comprises a loading chamber attached to the vacuum chamber in connection with the gate valve, a loading arm comprising an end defector for carrying the wafer, and an actuator for moving the end defector between the loading chamber and the chuck. The loading chamber and the vacuum chamber are in communication with each other through the gate valve. The loading chamber may comprise an access door through which a wafer can be placed onto and removed from the end defector. The end defector can be, for example, a planar fork type plate, which carries the wafer from the bottom. The loading arm may comprise a rod to an end of which the end defector is attached. The actuator can be connected to the rod and configured to move the rod in its longitudinal direction. The actuator can be, for example, a ball screw drive actuated by a motor. The actuator may comprise a linear moving mechanism that is connected to the rod. The rod goes through the loading chamber wall and the lead-through is hermetically sealed.

A wafer can be loaded onto the chuck as follows. First, the wafer is placed onto the end defector that is located inside the loading chamber. The gate valve is kept closed until the wafer placement has been completed and the desired conditions inside the loading chamber has been achieved. Next, the gate valve is opened, and the end defector is moved inside the vacuum chamber and further through the hatch inside the radiation shield. The hatch can be pushed open by the end defector as it is moved into the radiation shield, or the hatch can be opened by a separate mechanism. Finally, the wafer is transferred from the end defector onto the chuck and then the end defector is moved back into the loading chamber and the gate valve is closed.

According to an embodiment of the invention the hatch comprises a first thermal contact area and the end defector comprises a second thermal contact area for conducting heat from the end defector to the hatch when the end defector touches the hatch. The first thermal contact area is provided on the outer side of the hatch. The first and the second thermal contact area can be made of copper. An advantage of the first and the second thermal contact area is that the end defector as well as the wafer placed on the end defector can be cooled before they are moved inside the radiation shield. The longer the time the first thermal contact area is in contact with the second thermal contact area, the more the end defector and the wafer can be cooled.

According to an embodiment of the invention the hatch is hinged at its upper end to the radiation shield. Preferably, the hatch is arranged in such a manner that when it is in a vertical position it closes the opening in the radiation shield. In this case, the opening is closed automatically by the hatch due to gravity. The hatch can be opened by pushing it with the end defector. Alternatively, the hatch can be opened by a separate mechanism.

According to an embodiment of the invention the hatch comprises a spring for closing the hatch. The spring ensures that the hatch is closed properly.

According to an embodiment of the invention the testing device comprises a cooling unit that is thermally connected to the radiation shield. In this text, the expression "thermally connected" means that two members are connected such that heat can be conducted therebetween. The cooling unit is used for cooling the interior of the radiation shield to a desired testing temperature and for maintaining the testing temperature during testing of the integrated circuits. The testing temperature inside the radiation shield can be, for example, in the range of 1-4 K. The heat is transferred out of the radiation shield through one or more thermal links connected between the radiation shield and the cooling unit. The thermal link can be, for example, a cable or bar made of copper or aluminium.

According to an embodiment of the invention the cooling unit is thermally connected to the chuck and the probe card. The cooling unit is used for cooling the chuck and the probe card. As the chuck is cooled by the cooling unit, heat from the wafer that is mounted on the chuck may transfer to the chuck by conduction. Correspondingly, as the probe card is cooled by the cooling unit, heat from the wafer may transfer to the probe card when the probe card is in electrical contact with the integrated circuits. Heat is transferred by conduction through the contact pads of the integrated circuits and the contact elements of the probe card. The cooling unit thus enables to efficiently cool the wafer through the chuck and the probe card.

The cooling unit may have a plurality of temperature stages. Preferably, the chuck and the probe card are thermally connected to a temperature stage that provides a lower temperature than the temperature stage that is thermally connected to the radiation shield. The temperature provided by this temperature stage can be, for example, in the range of 0.8-1.2 K, or about 1 K. The heat is transferred away from the chuck through one or more thermal links connected between the chuck and the cooling unit. The heat is transferred away from the probe card through one or more thermal links connected between the probe card and the cooling unit. Preferably, the cooling unit is thermally connected to the probe card through a probe card holder. The thermal link can be, for example, a cable or bar made of copper or aluminium. An advantage of cooling the chuck and the probe card using the cooling unit is that the wafer can be more quickly and energy efficiently cooled to a desired testing temperature.

According to an embodiment of the invention the cooling unit is a dry cryostat using a closed loop helium circulation. When the dry cryostat is used, the vacuum chamber is kept at room temperature (not in a liquid nitrogen or liquid helium bath) and all the low temperature components are located inside the vacuum chamber. The dry cryostat may comprise a plurality of temperature stages, for example, 50 K, 4 K and 1 K stages. An advantage of the dry cryostat is that the wafer can be cooled to a temperature below 4 K without immersing the whole system into a liquid helium bath.

According to an embodiment of the invention the testing device comprises a plurality of nested radiation shields arranged inside the vacuum chamber, each of the nested radiation shields being provided with a hatch through which the wafer can be loaded onto the chuck. The number of the radiation shields can be, for example, 2, 3, 4 or more than 4. The chuck and the probe card are arranged inside the innermost radiation shield. An advantage of the plurality of nested radiation shields is an improved heat shielding of the testing device, whereby a desired testing temperature inside the innermost radiation shield can be achieved and maintained with less energy than in a testing device having only one radiation shield.

According to an embodiment of the invention the cooling unit has a plurality of temperature stages which are thermally connected to different radiation shields. The temperature stages of the cooling unit are configured to provide different temperatures to the radiation shields. The temperature stage that provides the lowest temperature is thermally connected to the innermost radiation shield, the temperature stage that provides the second lowest temperature is thermally connected to the second innermost radiation shield, and so on. By using the temperature stages, the innermost radiation shield can be cooled to a temperature in the range of 3-5 K, or about 4 K, and the second innermost radiation shield can be cooled to a temperature in the range of 45-55 K, or about 50 K. The heat is transferred out of the radiation shield through one or more thermal links connected between the temperature stage and the radiation shield. The thermal link can be, for example, a cable or bar made of copper or aluminium. An advantage of the cooling unit having a plurality of temperature stages is that the space in which integrated circuits are tested, i.e. the interior of the innermost radiation shield, can be more quickly and energy efficiently cooled to a desired testing temperature.

According to an embodiment of the invention the chuck comprises a plurality of heat conducting pins for holding the wafer on a base plate of the chuck. The heat conducting pins conduct heat from the wafer to the chuck. The chuck can be thermally connected to a cooling unit for transferring heat away from the chuck. The number of the heat conducting pins can be, for example, 3, 4, 5 or more than 5. The heat conducting pins can, for example, be made of copper. The base plate is made of a heat conducting material, such as copper or gold, or gold-plated copper, which enables heat to be efficiently conducted from the wafer to the base plate.

According to an embodiment of the invention the heat conducting pins are attached to the periphery of the base plate. The heat conducting pins are thus arranged to contact the outer edge of the wafer in order to hold the wafer on the base plate.

According to an embodiment of the invention at least one of the heat conducting pins is attached with a spring to the periphery of the base plate, the spring being movable in the plane of the base plate. The spring-operated pin can be moved with the end defector that loads a wafer onto the chuck. The spring ensures a good contact between the wafer and the heat conducting pins, and thus improves heat conduction from the wafer to the chuck.

According to an embodiment of the invention an outer end of the heat conducting pins has a shape of a truncated cone enabling to press the wafer against the base plate. The shape of the truncated cone ensures a good contact between the wafer and the heat conducting pins and the base plate, and thus improves heat conduction from the wafer to the chuck.

The exemplary embodiments of the invention presented in this text are not interpreted to pose limitations to the applicability of the appended claims. The verb "to comprise" is used in this text as an open limitation that does not exclude the existence of also unrecited features. The features recited in the dependent claims are mutually freely combinable unless otherwise explicitly stated.

DETAILED DESCRIPTION OF THE DRAWINGS

The same reference signs are used of the same or like components in different embodiments.

Figure 1A:
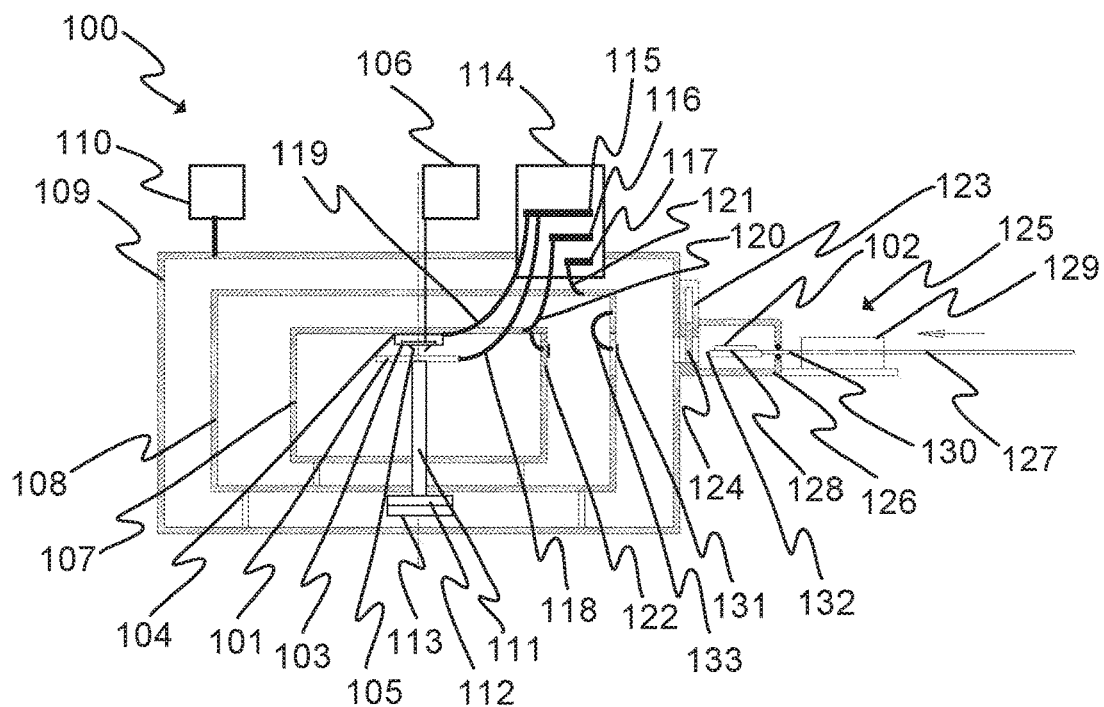
FIGS. 1A-1B illustrate the loading of a wafer into a testing device according to an embodiment of the invention.
Figure 1B:
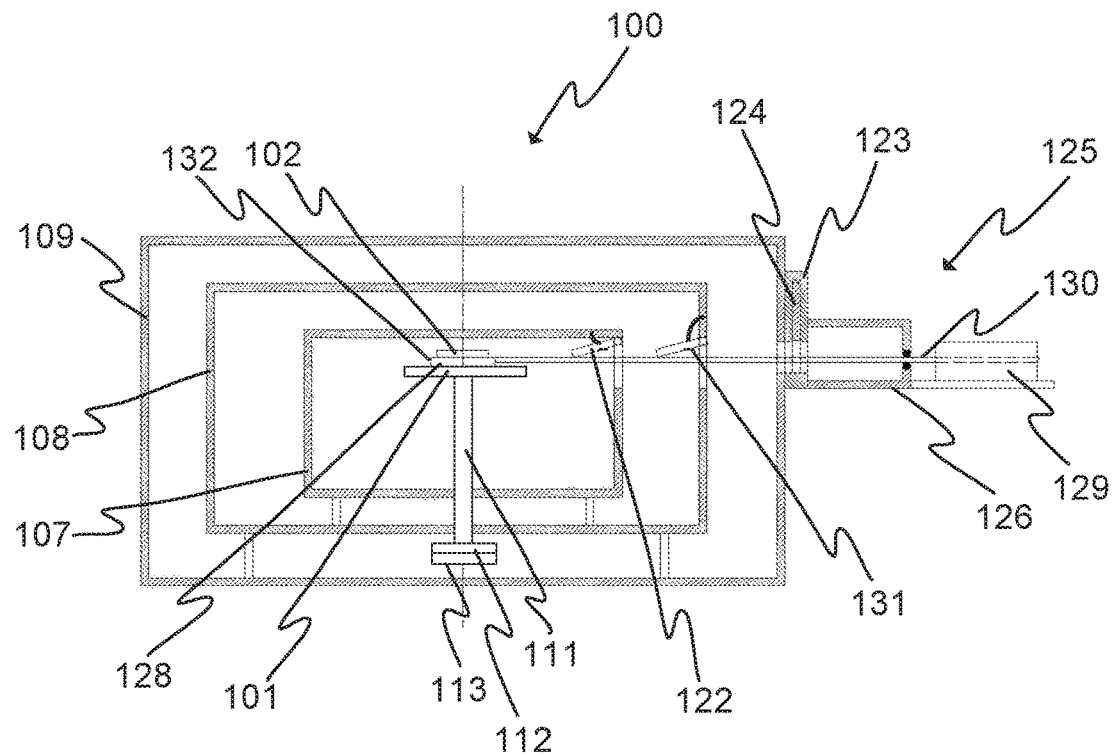

FIGS. 1A-1B illustrate the loading of a wafer into a testing device according to an embodiment of the invention. FIG. 1A illustrates a more detailed sectional drawing of the testing device than FIG. 1B.

The testing device 100 comprises a chuck 101 for holding the wafer 102 that comprises integrated circuits, and a probe card 103 attached to a probe card holder 104 for electrically contacting the integrated circuits on the wafer 102. The probe card 103 comprises contact elements 105, which can be arranged in electrical contact with contact pads of the integrated circuits. The electrical testing of the integrated circuits is done with an electronic testing unit 106 that is electrically connected to the probe card 103. The probe card 103 provides an electrical path between the electronic testing unit 106 and the integrated circuits on the wafer 102.

The testing device 100 comprises two nested radiation shields 107 and 108, which are arranged inside a vacuum chamber 109. The chuck 101 and the probe card 103 are arranged inside the innermost radiation shield 107. The vacuum chamber 109 allows the integrated circuits to be tested in a controlled environment. The pressure inside the vacuum chamber 109 is controlled with a vacuum pump 110.

The chuck 101 can be moved relative to the probe card 103 with moving means that comprise a supporting column 111 having a first end and a second end. The first end of the supporting column 111 is attached to the chuck 101 so that the chuck 101 is perpendicular with respect to the longitudinal axis of the supporting column 111. The moving means also comprise an actuator 112 for moving the supporting column 111 in three perpendicular directions, and an actuator 113 for rotating the supporting column 111 around its longitudinal axis. The actuators 112 and 113 are attached to the second end of the supporting column 111 so that the movement is transferred through the supporting column 111 to the chuck 101. The supporting column 111 is arranged to pass through the walls of the radiation shields 107 and 108 so that the first end of the supporting column 111 extends into the interior of the radiation shield 107, and the second end of the supporting column 111 extends out of the radiation shield 108.

The testing device 100 comprises a cooling unit 114 for cooling the wafer 102 to a desired testing temperature and for maintaining the testing temperature during testing of the integrated circuits. The cooling unit 114 comprises three temperature stages 115, 116 and 117, each of which is configured to provide a specific temperature to a part to which it is thermally connected. The first temperature stage 115 is thermally connected to the chuck 101 and the probe card 103. The temperature that can be achieved with the first temperature stage 115 is lower than the temperature that can be achieved with the second and third temperature stages 116 and 117. The heat is transferred away from the chuck 101 through a thermal link 118 connected between the first temperature stage 115 and the chuck 101. The heat is transferred away from the probe card 103 through a thermal link 119 connected between the first temperature stage 115 and the probe card holder 104. The second temperature stage 116 is thermally connected to the radiation shield 107 and the third temperature stage 117 is thermally connected to the radiation shield 108. The temperature that can be achieved with the second temperature stage 116 is lower than the temperature that can be achieved with the third temperature stage 117. The heat is transferred out of the radiation shield 107 through a thermal link 120 connected between the second temperature stage 116 and the radiation shield 107. The heat is transferred out of the radiation shield 108 through a thermal link 121 connected between the third temperature stage 117 and the radiation shield 108.

Each of the radiation shields 107 and 108 is provided with a hatch 122 that is attached to the side wall of the radiation shield 107, 108. The hatch 122 is hinged at its upper end to the radiation shield 107, 108 and arranged in such a manner that the hatch 122 may only open inwards. The hatch 122 is movable between a closed position and an open position. In the closed position, the hatch 122 closes an opening in the wall of the radiation shield 107, 108 so that the radiation is blocked. In the open position, the wafer 102 can be loaded onto or unloaded from the chuck 101. The hatch 122 is arranged in such a manner that the opening is closed automatically by the hatch 122 due to gravity.

The vacuum chamber 109 is provided with a gate valve 123. The gate valve 123 is attached to the side wall of the vacuum chamber 109, in connection with an opening. The gate valve 123 comprises a gate 124, which can be moved up and down to open and close the opening. When the gate valve 123 is closed, the interior of the vacuum chamber 109 is isolated from the surroundings. When the gate valve 123 is open, the wafer 102 can be loaded onto or unloaded from the chuck 101.

The testing device 100 comprises a wafer loading assembly 125 for loading the wafer 102 onto the chuck 101 through the gate valve 123 and the hatches 122. The wafer loading assembly 125 comprises a loading chamber 126 attached to the vacuum chamber 109 in connection with the gate valve 123. The loading chamber 126 and the vacuum chamber 109 are in communication with each other through the gate valve 123. The wafer loading assembly 125 further comprises a loading arm 127 comprising an end defector 128 for carrying the wafer 102, and an actuator 129 for moving the end defector 128 between the loading chamber 126 and the chuck 101. The loading arm 127 comprises a rod 130 to an end of which the end defector 128 is attached. The actuator 129 is connected to the rod 130 and configured to move the rod 130 in its longitudinal direction.

The wafer 102 is loaded onto the chuck 101 as follows. First, the wafer 102 is placed onto the end defector 128 that is located inside the loading chamber 126, as shown in FIG. 1A. The gate valve 123 is kept closed until the wafer 102 placement has been completed and the desired conditions inside the loading chamber 126 have been achieved. Next, the gate valve 123 is opened, and the end defector 128 is moved inside the vacuum chamber 109 and further through the hatches 122 inside the radiation shield 107. The hatches 122 are pushed open by the end defector 128 as it is moved towards the chuck 101. Each hatch 122 comprises a thermal contact area 131 and the end defector 128 comprises a thermal contact area 132 for conducting heat from the end defector 128 to the hatch 122 when the end defector 128 touches the hatch 122. Each hatch 122 is thermally connected with a thermal link 133 to the radiation shield 107 or 108. Finally, the wafer 102 is transferred from the end defector 128 onto the chuck 101, as shown in FIG. 1B.

Figure 2A:
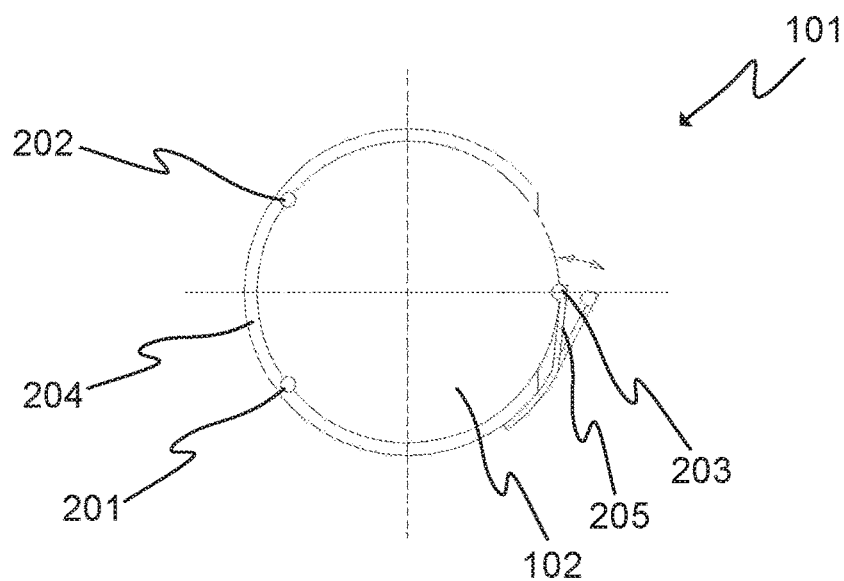
FIGS. 2A-2B illustrate an exemplary chuck.
Figure 2B:
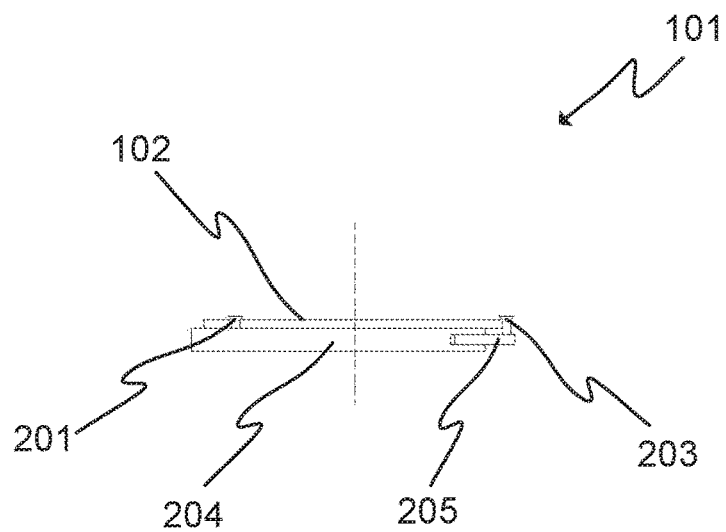

FIGS. 2A-2B illustrate an exemplary chuck for holding a wafer. FIG. 2A illustrates a top view and FIG. 2B a side view of the chuck. The chuck 101 comprises three heat conducting pins 201, 202 and 203 for holding the wafer 102 on a base plate 204 and for conducting heat from the wafer 102 to the base plate 204. The heat conducting pins 201, 202 and 203 are attached to the periphery of the base plate 204 enabling the heat conducting pins 201, 202 and 203 to contact the outer edge of the wafer 102 in order to hold the wafer 102 on the base plate 204. An outer end of the heat conducting pins 201, 202 and 203 has a shape of a truncated cone enabling to press the wafer 102 against the base plate 204. The heat conducting pin 203 is attached with a spring 205 to the periphery of the base plate 204. The spring 205 is movable in the plane of the base plate 204. The spring-operated pin 203 can be moved with an end defector (not shown in FIGS. 2A-2B) that loads the wafer 102 onto the chuck 101.

Only advantageous exemplary embodiments of the invention are described in the figures. It is clear to a person skilled in the art that the invention is not restricted only to the examples presented above, but the invention may vary within the limits of the claims presented hereafter. Some possible embodiments of the invention are described in the dependent claims, and they are not to be considered to restrict the scope of protection of the invention as such.

The invention claimed is:

1. A testing device, comprising:
   a vacuum chamber,
   a chuck for holding a wafer that comprises integrated circuits,
   a probe card for electrically contacting the integrated circuits on the wafer, and
   a radiation shield comprising an enclosure arranged inside the vacuum chamber and enclosing the chuck and the probe card,
   wherein:
      the vacuum chamber comprises a gate valve,
      the radiation shield comprises a hatch, and
      the testing device comprises a wafer loading assembly for loading the wafer onto the chuck through the gate valve and the hatch.

2. The testing device according to claim 1, wherein the wafer loading assembly comprises:
   a loading chamber attached to the vacuum chamber in connection with the gate valve,
   a loading arm comprising an end defector for carrying the wafer, and
   an actuator for moving the end defector between the loading chamber and the chuck.

3. The testing device according to claim 2, wherein the hatch comprises a first thermal contact area and the end defector comprises a second thermal contact area for conducting heat from the end defector to the hatch when the end defector touches the hatch.

4. The testing device according to claim 1, wherein the hatch is hinged at its upper end to the radiation shield.

5. The testing device according to claim 1, the testing device comprises a cooling unit thermally connected to the radiation shield.

6. The testing device according claim 5, wherein the cooling unit is thermally connected to the chuck and the probe card.

7. The testing device according to claim 5, wherein the cooling unit is a dry cryostat using a closed loop helium circulation.

8. The testing device according to claim 1, further comprising an additional radiation shield, wherein the radiation shields are nested inside the vacuum chamber.

9. The testing device according to claim 8, comprising a cooling unit having a plurality of temperature stages which are thermally connected to different radiation shields.

10. The testing device according to claim 1, wherein the chuck comprises a plurality of heat conducting pins for holding the wafer on a base plate of the chuck.

11. The testing device according to claim 10, wherein the heat conducting pins are attached to the periphery of the base plate.

12. The testing device according to claim 10, wherein at least one of the heat conducting pins is attached with a spring to the periphery of the base plate, the spring being movable in the plane of the base plate.

13. The testing device according to claim 10, wherein an outer end of the heat conducting pins has a shape of a truncated cone enabling to press the wafer against the base plate.

* * * * *